United States Patent
Asahina et al.

(10) Patent No.: US 6,326,287 B1
(45) Date of Patent: Dec. 4, 2001

(54) SEMICONDUCTOR DEVICE AND METHOD OF FABRICATING THE SAME

(75) Inventors: Michio Asahina, Sakata; Kazuki Matsumoto, Chino; Eiji Suzuki, Fujimi-machi, all of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/384,210

(22) Filed: Aug. 27, 1999

(30) Foreign Application Priority Data

Sep. 3, 1998 (JP) .................................................. 10-250138
Dec. 28, 1998 (JP) .................................................. 10-374108

(51) Int. Cl.[7] .................................................. H01L 21/20
(52) U.S. Cl. .................................. 438/584; 438/360; 438/627; 257/750; 35/70
(58) Field of Search ..................................... 438/360, 627, 438/584, 591, 589, 592, 595, 596, 607, 608, 610, 612; 357/70; 257/750, 753

(56) References Cited

U.S. PATENT DOCUMENTS

| | | | |
|---|---|---|---|
| 4,908,078 | * | 3/1990 | Muramatsu et al. .................. 148/439 |
| 5,010,039 | * | 4/1991 | Ku et al. .............................. 437/228 |
| 5,019,891 | * | 5/1991 | Onuki et al. ............................. 357/70 |
| 5,180,689 | * | 1/1993 | Liu et al. .............................. 437/228 |
| 5,918,149 | | 6/1999 | Besser et al. ......................... 438/680 |
| 5,956,608 | * | 9/1999 | Khurana et al. ...................... 438/627 |
| 5,985,759 | * | 11/1999 | Kim et al. ............................. 438/653 |
| 6,054,768 | * | 4/2000 | Givens et al. ....................... 257/753 |

FOREIGN PATENT DOCUMENTS

| | | | | |
|---|---|---|---|---|
| WO 98/24116 | * | 6/1998 | (CA) ........................... H01L/21/285 |
| 2049507 A | * | 4/1974 | (DE) ............................. H01L/15/02 |
| 2-159064 | | 6/1990 | (JP) . |
| 2-229433 | | 9/1990 | (JP) . |
| 06-077162 | * | 3/1994 | (JP) ............................... H01L/21/28 |

\* cited by examiner

Primary Examiner—Matthew Smith
Assistant Examiner—Remzo N. Rocchegiani
(74) Attorney, Agent, or Firm—Oliff & Berridge, PLC

(57) ABSTRACT

A semiconductor device comprising a semiconductor substrate including an electronic element such as a MOSFET, interlayer dielectric (silicon oxide layer or BPSG layer) formed on the semiconductor substrate, a through-hole formed in the interlayer dielectric, a barrier layer formed on a surface of the interlayer dielectric and on a surface of the through-hole, and a metal wiring layer formed on the barrier layer. The metal wiring layer contains aluminum as its major component and 0.1 wt % to 3 wt % of beryllium. An aluminum alloy can be embedded in the through-hole without creation of any void or breaking of wire, and the semiconductor device is highly resistant to electromigration.

25 Claims, 7 Drawing Sheets

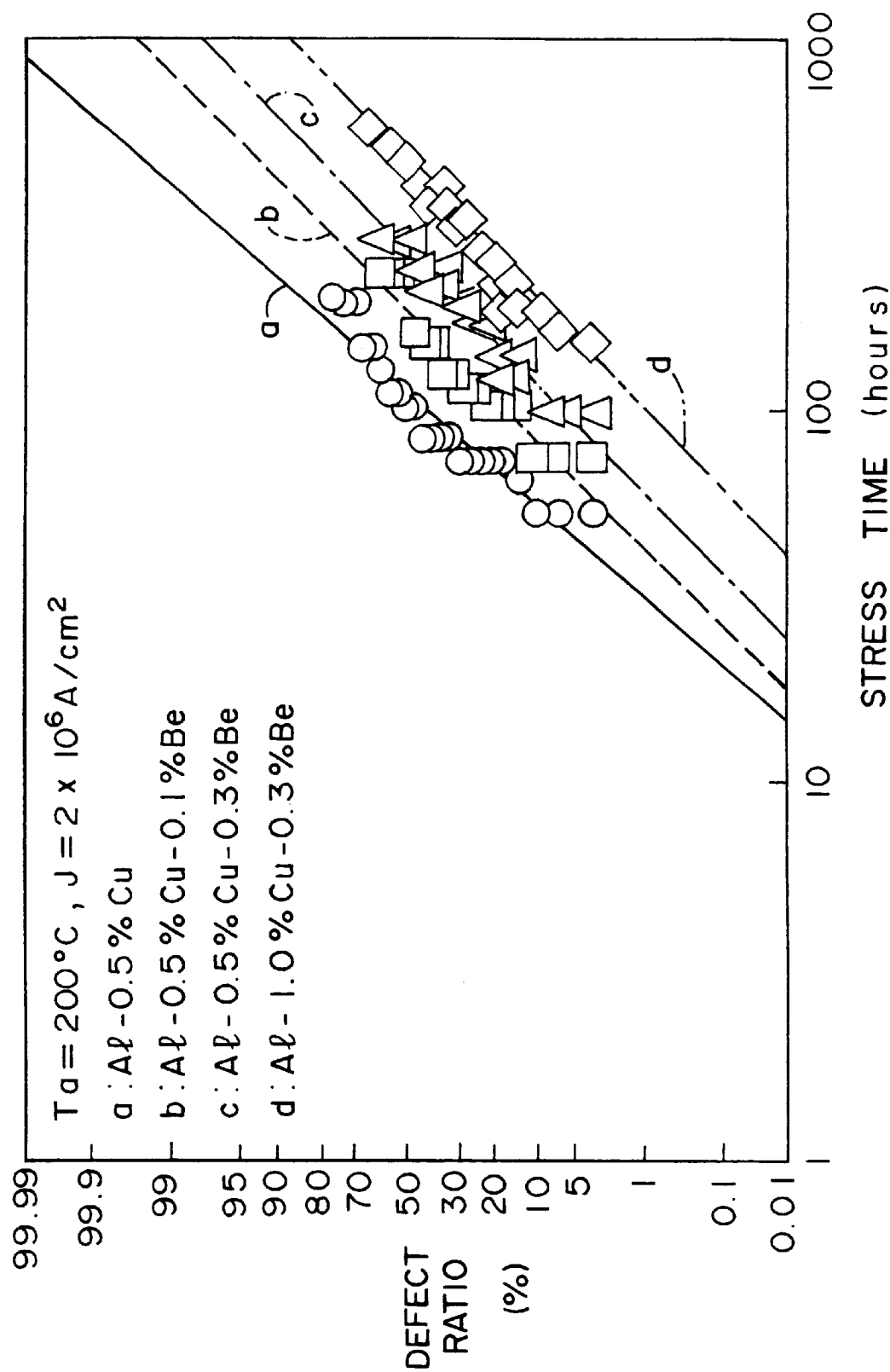

SEMICONDUCTOR DEVICE AND METHOD OF FABRICATING THE SAME

BACKGROUND OF THE INVENTION

1. Field of the Invention

The present invention relates to a semiconductor device and a method of fabricating the same, and, more particularly, to a semiconductor device which can be miniaturized and has a wiring layer made of an aluminum alloy having high electro-migration resistance, and to a method of fabricating the same.

2. Description of Related Art

In semiconductor devices such as LSIs, recent advances in miniaturization, integration, and multi-layering of electronic elements have required through-holes with a large aspect ratio. It is difficult to embed wiring materials into such through-holes, and this has become an important technical problem in recent years. Therefore, attempts have been made to embed aluminum or an aluminum alloy which is useful as a wiring material into the through-holes.

Customary methods, however, require high temperature in sputtering to bury aluminum or an aluminum alloy in a through-hole. As the temperature increases, whiskers are easily produced, causing short circuits between wires, and aluminum of a wiring layer in the through-hole reacts with silicon in a substrate giving easy rise to electrical characteristic problems such as leaks. Recent advances in miniaturization and integration of electronic elements have required further flatness of deposited layers and also formation of a thinner film of wiring layers. However, if the wiring layer is thin, the electro-migration resistance is reduced and hence conventionally used aluminum alloy materials cannot adequately cope with this phenomenon.

SUMMARY OF THE INVENTION

It is an object of the present invention to provide a semiconductor device using, as a wiring material, a specific aluminum alloy which can be embedded in a through-hole without producing any void or wire breaking, and being highly resistant to electro-migration. It is a further object of the present invention to provide a method of fabricating such semiconductor device.

According to a first aspect of the present invention, there is provided a semiconductor device comprising a semiconductor substrate including an electronic element, at least one metal wiring layer, and at least one interlayer dielectric, wherein the metal wiring layer contains aluminum as a major component and 0.1–3 wt % of beryllium.

In the semiconductor device, an aluminum alloy containing a specific quantity of beryllium is used as a metal wiring material to thereby obtain a metal wiring layer which is highly resistant to electro-migration. Although the reason is not clear, it is considered that a beryllium alloy (for instance, a beryllium/copper alloy or an aluminum/beryllium/copper alloy) precipitates at the grain boundary of the aluminum, thereby inhibiting the electro-migration of aluminum.

Beryllium is also capable of occluding oxygen. For instance, beryllium occludes oxygen which is produced from silicon oxide of an interlayer dielectric and exists in an aluminum alloy to improve the fluidity of aluminum and the capability of embedding an aluminum alloy in a through-hole.

Moreover, trace titanium and magnesium improve the effect of occluding oxygen, which further improves the capability of embedding an aluminum alloy in a through-hole. At least one of magnesium and titanium may be contained in a proportion of 0.1 to 3 wt %.

A gasifiable component may be excluded from the interlayer dielectric by thermal processing. A contact section formed of an aluminum alloy having excellent step coverage can be formed by removing a gasifiable component produced in the interlayer dielectric. The reason will be described later.

In the semiconductor device, an oxide of a metal that is included in the barrier layer may be distributed in the barrier layer in an island-like configuration. This structure increases the barrier capability of the barrier layer as compared with the case where the barrier layer does not include a metal oxide.

The reason is considered to be as follows. For instance, a barrier layer containing titanium has been considered to be in an amorphous state. However, it has been clarified from the studies of the inventors of the present invention that, in the barrier layer of the present invention, crystal grains of titanium oxide ($TiO_2$) are dispersed in an island-like configuration at random in a titanium nitride layer which has a disordered crystal structure. Titanium oxide is an almost perfect insulating material and is a material in which a metal such as aluminum is diffused with extreme difficulty. The presence of such titanium oxide grains formed in an island-like configuration in the barrier layer disarranges the crystal structure of titanium nitride to inhibit the intrusion of aluminum which diffuses beyond the grain boundary (boundary between crystal grains). As a consequence, the barrier capability of the barrier layer is outstandingly improved. This phenomenon also occurs when the barrier layer contains a metal such as cobalt or tungsten.

An oxide of a metal that is included in the barrier layer exists in a manner that it is dispersed island-like in the barrier layer and hence does not inhibit the electroconductivity of the barrier layer. In other words, the grains of the metal oxide contained in the barrier layer are preferably dispersed in such a condition that the electroconductivity of the barrier layer is not inhibited.

Preferably the average particle diameter of the grains of the oxide of a metal that is included in the barrier layer may be in a range between 2 and 20 nm taking the barrier capability and the electroconductivity into consideration.

According to a second aspect of the present invention, there is provided a method of fabricating a semiconductor device comprising the steps of: (a) forming a through-hole in an interlayer dielectric; and (b) forming a metal wiring layer by depositing a metal layer that contains aluminum as its major component and 0.1–3 wt % of beryllium, on the interlayer dielectric and in the through-hole.

The fabrication method according to the present invention can improve the fluidity of an aluminum alloy as stated above with the result that the temperature for sputtering the aluminum alloy layer can be reduced. The fabrication method of the present invention therefore not only restrains the occurrence of whiskers caused by the growth of an aluminum monocrystal, which is produced at high temperatures, but also prevents the development of short circuits between wiring layers. Moreover, in a contact hole on the substrate including electronic elements, the reaction between aluminum in the wiring layer and silicon in the substrate can be restrained by reducing the temperature in the sputtering of the aluminum alloy layer. This results in resistance to a rise in the electric characteristics problem such as leaks.

In the step (b), the metal wiring layer may be formed by sputtering a target material containing aluminum as its major component and 0.1–3 wt % of beryllium at a temperature of 500° C. or less. The target material may further include at least one of magnesium and titanium in an amount of 0.1 to 3 wt % where necessary. It may also include copper and silicon as required.

In the step (b), the metal wiring layer may be formed by: a step of forming a first aluminum layer comprising an alloy containing aluminum as its major component at a temperature of 200° C. or less; and a step of forming a second aluminum layer comprising an alloy containing aluminum as its major component at a temperature of 300–500° C. on the first aluminum layer.

The first aluminum layer is formed at temperatures of 200° C. or less and preferably 30 to 100° C. thereby restraining gasification of gasifiable components contained in the interlayer dielectric and intermediate layers between the interlayer dielectric and the aluminum layer. Here, the intermediate layers means those present between the interlayer dielectric and the aluminum layer, that is, a barrier layer, a wetting layer or the like. Since the gas produced and emitted externally from the intermediate layer is restrained, a reduction in the wettability of the intermediate layer can be prevented. As a consequence, the first aluminum layer adheres very well to the intermediate layer, enabling formation of a film with high step coverage.

The presence of the first aluminum layer ensures that the gas produced from the intermediate layers such as an interlayer dielectric and a barrier layer which are formed under the first aluminum layer can be restrained even if the temperature of the substrate rises. In the step of forming the second aluminum layer, accordingly, the second aluminum layer can be formed at a relatively high temperature, that is, high temperatures at which an aluminum alloy can flow and diffuse, preferably at 300 to 500° C. and more preferably at 350 to 450° C.

The step (b) including the step of forming the first aluminum layer at relatively low temperatures and the step of forming the second aluminum layer at relatively high temperatures makes it possible to provide high step coverage in the through-hole without the production of any void. Moreover, it has been confirmed that the fabrication method of the present invention can be applied to the case of using a through-hole with a diameter of 0.2 μm.

In the formation of the aluminum layer in the step (b), the first aluminum layer and the second aluminum layer may be continuously formed in the same chamber. The temperature of the substrate can be controlled with ease and also the atmosphere can be controlled with accuracy when two aluminum layers are formed in the same chamber continuously. A disadvantageous phenomenon such as formation of an oxide layer on the first aluminum layer can be thereby avoided.

In the fabrication method of the present invention, the temperature of the substrate may be cooled to 100° C. or less, and preferably to room temperature to 50° C., prior to the formation of the first aluminum layer. The temperature of the substrate can be reduced sufficiently prior to the formation of the first aluminum layer by cooling the substrate in this step. The low temperature secured in this step enables accurate temperature control in the subsequent step (b) because, in the degassing step mentioned later, the temperature of the substrate is preferably designed to be as high as 300° C. or more.

In the fabrication method of the present invention, the step (b) may be followed by a thermal processing performed at a temperature of 200 to 500° C. Beryllium contained in aluminum tends to precipitate by this thermal processing.

The fabrication method of the present invention may further comprise a degassing step of eliminating a gasifiable component contained in the interlayer dielectric by a thermal processing performed at a substrate temperature of 300 to 550° C. under a reduced pressure, after the step (a). The inclusion of the step of eliminating a gasifiable component contained in the interlayer dielectric serves to restrain the production of gas, such as moisture, nitrogen, hydrogen and oxygen, contained in the interlayer dielectric in the following step of forming the second aluminum layer at temperatures as high as 300° C. or more, for example.

The inventors of the present invention have confirmed that gas produced from such an interlayer dielectric is absorbed by an intermediate layer such as a barrier layer or a wetting layer but is not absorbed by an aluminum layer formed in the through-hole. It is therefore possible to positively restrain a reduction in the wettability of the intermediate layer and the occurrence of voids, caused by the presence of such a gas between the intermediate layer and the first aluminum layer, by eliminating the gasifiable components contained in the interlayer dielectric. This results in the formation of a contact portion comprising an aluminum layer with high coverage and low resistance in the through-hole.

Here, the "gasiiable component" includes gasifiable components such as water, hydrogen, oxygen and nitrogen, which are produced from deposited layers, namely, an interlayer dielectric and intermediate layers, at a substrate temperature of 300° C. or more under a reduced pressure. The words "under a reduced pressure" mean a pressure of 0.1 to 1 Pa desirably.

The fabrication method of the present invention may further comprise a step of forming a barrier layer at least on a surface of the interlayer dielectric on the semiconductor substrate and on a surface of the through-hole formed in the interlayer dielectric, the barrier layer being formed by introducing oxygen into a layer which will become the barrier layer to distribute an oxide of a metal that is included in the barrier layer in an island-like configuration.

In this step, the following two methods may be adopted. In a first method, a layer that will become the barrier layer is deposited and then exposed to oxygen plasma under a reduced pressure, followed by annealing. In the second method, a layer that will become the barrier layer is deposited and then thermally processed in an oxygen atmosphere.

BRIEF DESCRIPTION OF THE DRAWINGS

FIG. 8 is a view showing the result of an electro-migration test for samples of a semiconductor device in accordance with the present invention and for comparative examples.

DETAIL DESCRIPTION OF THE PREFERRED EMBODIMENTS

Figure 1A:
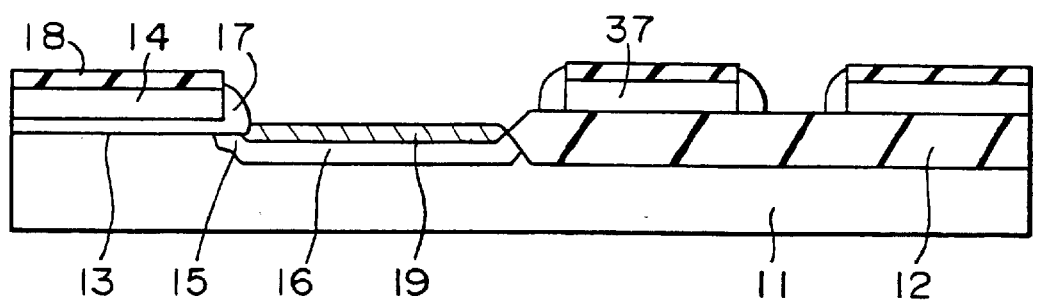
FIGS. 1A, 1B, and 1C are schematic cross-sectional views showing the processing sequence in an example of the method of fabricating a semiconductor device in accordance with the present invention.
Figure 1B:
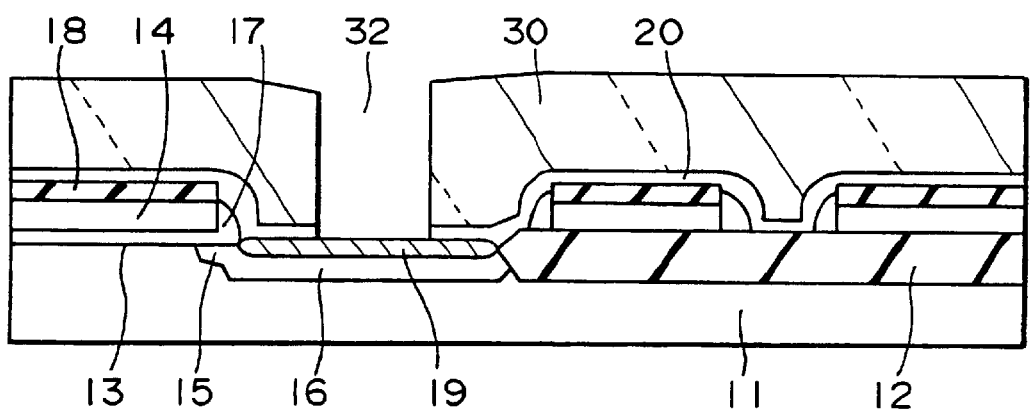
Figure 1C:
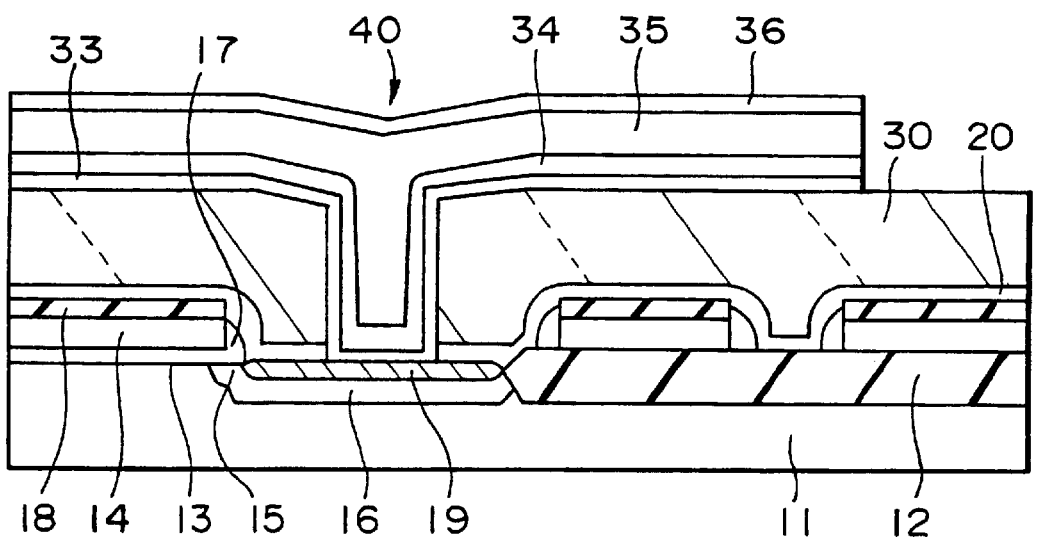

FIGS. 1A, 1B and 1C are schematic cross-sectional views which illustrate an embodiment of the method of fabricating a semiconductor device and a resultant semiconductor device in accordance with the present invention.

An example of this method of fabricating a semiconductor device will be described below.

A. Fabrication of Electronic Element

A MOS element is first formed on a silicon substrate 11 by a generally used method. More specifically, a field insulation layer 12 is formed on the silicon substrate 11 by selective oxidation and a gate oxide layer 13 is formed in an active region thereof, by way of example. After the threshold voltage has been adjusted by channel implantation, monosilane ($SiH_4$) is thermally decomposed to grow a polysilicon layer, then tungsten silicide is formed by sputtering on that polysilicon layer. A silicon oxide layer 18 is superimposed thereon, and this is etched to a predetermined pattern to form a gate electrode 14. At the same time, a wiring layer 37 is formed from the polysilicon layer and tungsten silicide layer on the field insulation layer 12, if necessary.

A low-concentration impurity layer 15 of the source or drain region is then formed by the implantation of phosphorus ions. After side-wall spacers 17 has been formed from the silicon oxide layer on the sides of the gate electrode 14, arsenic ions are implanted, and these impurities are activated by annealing using a halogen lamp to form a high-concentration impurity layer 16 for the source or drain region.

A silicon oxide layer having a thickness of not more than 100 nm is then formed by vapor deposition, and a predetermined silicon substrate region is exposed by selectively etching this layer in a mixed aqueous solution of hydrogen fluoride (HF) and $NH_4F$. Subsequently, for example, a titanium monosilicide layer is formed on the surface of the naked silicon substrate and a titanium-rich titanium nitride (TiN) layer is formed on the silicon oxide layer 18 by sputtering titanium to a thickness of approximately 30 to 100 nm and by transit annealing for approximately a few seconds to 60 seconds at a temperature of 650° C. to 750° C. in a nitrogen atmosphere in which oxygen is controlled to be not more than 50 ppm. The wafer is then immersed in a mixed aqueous solution of ammonium hydroxide ($NH_4OH$) and hydrogen peroxide ($H_2O_2$) to etch away the titanium nitride layer, leaving the titanium monosilicide layer only on the surface of the silicon substrate. Lamp annealing at 750° C. to 850° C. is then performed to convert the monosilicide layer to disilicide, so that the titanium silicide layer 19 is formed in a self-aligned manner on the surface of the high-concentration impurity layer 16.

Note that if the gate electrode 14 is formed of polysilicon alone and is exposed by selective etching, a titanium salicide structure in which the gate electrode is separated by sidewall spacers from both of the source and drain regions is formed.

B. Formation of Interlayer Dielectric

First of all, as an interlayer dielectric, the silicon oxide layer 20 having a thickness of 100 to 200 nm is formed by a plasma reaction of tetraethoxysilane (TEOS) and oxygen. This silicon oxide layer 20 forms an extremely fine layer with better insulating properties than a layer grown from monosilane ($SiH_4$) and with a slower etching speed in an aqueous hydrogen fluoride solution, and without any oxidation or cusping of the silicide layer 19.

In this case, the silicon oxide layer is formed directly on the titanium silicide layer 19. If the layer-formation temperature is high, the oxidizing gases will react with the titanium silicide in the initial stages of the layer formation, making cracking and peeling likely to occur, so the processing temperature is preferably 600° C. or less, or more preferably between 250° C. to 400° C. Once the silicon oxide layer has been formed to a thickness of approximately 100 nm on the titanium silicide layer 19 at this comparatively low temperature, raising the temperature to approximately 900° C. for annealing or vapor-phase oxidation performed in a non-steam oxidizing atmosphere will not cause any problems.

Next, as an interlayer dielectric, there is formed a Boron-Phospho Silicate Glass (BPSG) layer 30 having a thickness of approximately hundreds nm to 1 µm on the silicon oxide layer 20, by a vapor-phase reaction of a silane compound such as $SiH_4$ or TEOS, oxygen or ozone, and gases containing phosphorus and boron. Then, the wafer is annealed in a nitrogen atmosphere at a temperature of 800 to 900° C. to be flattened by a high temperature flow. Flattening may be performed by utilizing a commonly-used Spin-On-Glass (SOG) layer, instead of the high temperature flow of the BPSG layer 30.

In addition, instead of the BPSG layer 30, a silicon oxide layer (hereinafter referred to as "a first silicon oxide layer") that is formed by using a chemical vapor deposition method to cause a silicon compound and hydrogen peroxide to react, as described in patent applications filed by the applicant of the present invention such as Japanese Patent Application No. 9-314518, may also be used. The silicon oxide layer is inherently highly fluid and has superior self-flattening characteristics. The mechanism is considered to be due to the fact that, when a silicon compound and hydrogen peroxide are made to react by a chemical vapor deposition method, silanol will be formed in vapor phase, and the deposition of the resultant silanol on a wafer surface causes the formation of a layer having a high degree of fluidity. The technique for this silicon oxide layer will now be described.

When monosilane is used as the silicon compound, for example, the reactions given by Reaction Formulas (1) and (1') or the like below result in the formation of silanol:

$SiH_4+2H_2O_2 \rightarrow Si(OH)_4+2H_2$  Formula (1)

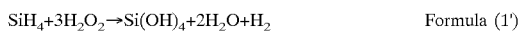
$SiH_4+3H_2O_2 \rightarrow Si(OH)_4+2H_2O+H_2$  Formula (1')

The silanol formed in accordance with Reaction Formulas (1) and (1') desorbs water by the polycondensation reaction of Reaction Formula (2), to form silicon oxide.

$Si(OH)_4 \rightarrow SiO_2+2H_2O$  Formula (2)

Examples of silicon compounds that can be used are inorganic silane compounds such as monosilane, disilane, $SiH_2Cl_2$, and $SiF_4$, and organic silane compounds such as $CH_3SiH_3$, tripropylsilane and tetraethoxysilane.

The formation step of this silicon oxide layer is preferably performed by the reduced pressure chemical vapor deposition method under temperature conditions of 0° C. to 20° C. if the silicon compound is an inorganic silicon compound, or under temperature conditions of 100° C. to 150° C. if the silicon compound is an organic silicon compound. If the temperature of this formation step is higher than the above maximum value, the polycondensation reaction of Reaction Formula (2) proceeds too fast, reducing the fluidity of the first silicon oxide layer and making it difficult to obtain a good flatness. If the temperature is lower than the above minimum value, the dicomposed moisture will be adsorbed within the chamber and dew condensation will occur outside of the chamber, making it difficult to control the fabrication apparatus.

The first silicon oxide layer is preferably formed to a sufficient thickness to cover any unevenness in the surface of the silicon substrate. The minimum thickness of the first silicon oxide layer depends on the height of any unevenness in the surface of the silicon substrate comprising the electronic element, but this thickness is preferably 300 to 1000 nm. If the thickness of the first silicon oxide layer exceeds that maximum value, stresses in the layer itself will cause cracks to occur.

It is desirable to cause silicon compounds, at least one substance selected from oxygen and compounds comprising oxygen, and a compound including an impurity to react by the chemical vapor deposition to form a porous second silicon oxide layer on the first silicon oxide layer.

Not only does this second silicon oxide layer function as a capping layer, but its porosity also allows any gasifiable components that are generated from the first silicon oxide layer in a subsequent annealing step to escape gradually. In addition to being porous, by adding an impurity such as phosphorus or boron, preferably phosphorus, this second silicon oxide layer can relieve stresses within that layer by weakening the strength of bonds between the Si and O molecules of the silicon oxide of that layer. In other words, the resultantly formed layer can be made adequately soft and difficult to break. A further important role of this second silicon oxide layer is that the impurity, such as phosphorus, within the silicon oxide layer functions as a getter of mobile ions, such as alkali ions, that have an adverse effect on the reliability of the electronic element. The concentration of the impurity within the second silicon oxide layer is preferably 1 to 6 wt % considered from the viewpoints of this gettering function and stress relaxation in the layer.

The second silicon oxide layer has a compressive stress of 100 to 600 MPa, so it has the function of preventing any increase in the tensile stresses that occur in the first silicon oxide layer during the polycondensation, thus preventing cracking. This second silicon oxide layer has the further function of preventing the absorption of moisture by the first silicon oxide layer.

The second silicon oxide layer is preferably formed by a plasma chemical vapor deposition method under temperature conditions of 300° C. to 450° C. and at a high frequency of 1 MHz or less. Forming the layer under these temperature conditions makes it easy for gasifiable components to escape in the initial stages of a subsequent annealing step, further improving the reliability of the device.

The compound comprising oxygen that is used in the step of forming the second silicon oxide layer is preferably dinitrogen monoxide ($N_2O$). The use of dinitrogen monoxide as the reaction gas makes it possible to encourage the desorption of gasifiable components (hydrogen and water) within the first silicon oxide layer during the formation of the second silicon oxide layer, because dinitrogen monoxide in a plasma state reacts easily with the hydrogen bonds (—H) in the silicon compound of the first silicon oxide layer. Instead of a plasma chemical vapor deposition method, the second silicon oxide layer could be formed by a normal-pressure chemical vapor deposition method under temperature conditions of 300° C. to 550° C. In such a case, the compound comprising oxygen is preferably ozone.

It is also preferable to expose the first silicon oxide layer to an ozone atmosphere before the second silicon oxide layer is formed. Such exposure encourages the desorption of hydrogen and water from the first silicon oxide layer because ozone reacts easily with the hydrogen bonds (—H) or hydroxyl groups (—OH) in the silicon compound of the first silicon oxide layer.

The thickness of the second silicon oxide layer is determined from considerations of flatness and crack prevention, and is preferably at least 100 nm.

After the first and second silicon oxide layers are formed, performing the annealing at a temperature of 600° C. to 850° C. makes the first and second silicon oxide layers dense and improves the insulating properties and moisture resistance thereof. In other words, as seen from the first silicon oxide layer, the polycondensation reaction defined by Reaction Formula (2) is completed in the initial stages of this annealing and the water and hydrogen generated by this reaction are released to the outside through pores in the second silicon oxide layer, so that the first silicon oxide layer is densified in a state in which the gasifiable components have been thoroughly removed therefrom. In addition, the second silicon oxide layer is converted from a porous state to a dense state by this annealing.

By setting the temperature to at least 600° C. in this annealing, it is possible to make the first and second silicon oxide layers sufficiently dense, and it is possible that the impurities in the source and drain diffusion layers of the MOS element can be sufficiently activated. Setting this annealing temperature to not more than 850° C. makes it possible to flatten the interlayer dielectric at a temperature that is lower than that necessary for a conventional art BPSG layer, and also ensures that the first and second silicon oxide layers are sufficiently dense. An annealing temperature in excess of 850° C. causes problems such as an unnecessary broadening of the source and drain diffusion layers leading to punch-through, which makes it difficult to miniaturize the electronic element.

Forming a porous second silicon oxide layer on the first silicon oxide layer ensures that the second silicon oxide layer has a suitable flexibility during the annealing, even if there is a rapid temperature change as occurs when the wafer is directly exposed to a temperature from 600° C. to 850° C., so it can absorb the stresses of the first silicon oxide layer and thus the annealing can be performed without any cracks occurring in the first silicon oxide layer.

Formation of Through-hole

The BPSG layer 30 and silicon oxide layers 20 forming the interlayer dielectric are then selectively and anisotropically etched by a reactive ion etcher using $CHF_3$ and $CF_4$ as main gases, to form a through-hole 32 having a diameter of between 0.2 and 0.5 µm.

C. Degassing

The thermal processing that includes a degassing step will now be described.

Lamp heating (thermal processing A) is performed in a lamp chamber for 30 to 60 seconds at a base pressure of $1.5 \times 10^{-4}$ Pa or less and a temperature of 150° C. to 250° C. Then degassing is performed by thermal processing (degassing step: thermal processing B) for 30 to 120 seconds at a temperature of 300° C. to 550° C. in a separate chamber into which argon is introduced at a pressure of $1 \times 10^{-1}$ to $15 \times 10^{-1}$ Pa.

During this procedure, the first thermal processing A heats the entire wafer, including the rear and side surfaces thereof, to enable the removal of any moisture or the like adhering to the wafer.

The subsequent thermal processing B makes it possible to remove gasifiable components (oxygen, hydrogen, water and nitrogen), mainly from within the BPSG layer 30 forming the interlayer dielectric. As a result, the generation of gasifiable components from the BPSG layer during the subsequent step for forming the barrier and aluminum layers can be prevented.

In the present embodiment, a barrier layer 33 comprises a first barrier layer having a barrier function, and a second barrier layer which is a conductive layer. The second barrier layer is formed between the first barrier layer with a high resistance and the impurity diffusion layer which are formed on the silicon substrate to increase the conductivity with a source region or a drain region. It is preferable that an ordinary substance such as a nitride of titanium or cobalt, for example, be used as the first barrier layer. A refractory metal such as titanium or cobalt can be used as the second barrier layer which is a conductive layer. The titanium or cobalt reacts with the silicon of the substrate to form a silicide.

Since the barrier layer, comprising titanium nitride and titanium layers for example, has gasifiable components (oxygen, hydrogen, water, and nitrogen) in solid solution therein, which can be several tens of atom %, removing the gasifiable components from the BPSG layer 30 of the interlayer dielectric, before the layer is formed, is extremely effective for forming a good aluminum layer within the through-hole. If the gasifiable components in the BPSG layer underlying the barrier layer are not removed sufficiently, the gasifiable components within the BPSG layer will be released at the temperature achieved during the formation of the barrier layer (ordinarily: 300° C. or more), and these gases will be taken up into the barrier layer. In addition, these gases will be desorbed from the barrier layer and will exit from the boundary surface with the aluminum layer during the formation of the aluminum layer, which will have adverse effects on the adhesiveness and fluidity of the aluminum layer.

Formation of Barrier Layer

A titanium layer is formed by sputtering to a thickness of 20 to 70 nm, as the second barrier layer of the barrier layer 33, then a titanium nitride layer is formed in a separate chamber to a thickness of 30 to 150 nm, as the first barrier layer. The temperature for the barrier layer formation depends on the thickness thereof, but is selected to be within the range of 200° C. to 450° C.

The wafer is then exposed to oxygen plasma at a pressure of $0.1 \times 10^2$ Pa to $1.5 \times 10^2$ Pa for 10 to 100 seconds, and is annealed in a nitrogen or hydrogen atmosphere at 450° C. to 700° C. for 10 to 60 minutes so that titanium oxide is formed like islands within the titanium nitride layer in the barrier layer. This processing has been verified to improve the barrier capabilities of the barrier layer.

Titanium oxide can also be formed in the barrier layer in an island-like configuration by thermal processing at a temperature of 400° C. to 800° C. in a lamp annealing furnace containing at least from several hundreds ppm up to several percentages of oxygen. This procedure can also improve the barrier capabilities of the barrier layer.

Although the present embodiment has been described with titanium oxide as a metal oxide distributed in the barrier layer, the oxide of any other metal such as, for example, cobalt or tungsten, can also be used in the barrier layer.

In a case of cobalt, a barrier layer with cobalt oxide scattered like islands in a cobalt nitride layer can be formed by forming a cobalt layer having a thickness of 5 to 30 nm and the cobalt nitride layer having a thickness of 20 to 100 nm using sputtering in different chambers and subsequently by applying thermal processing similar to the case using titanium described above. This barrier layer has also been verified to provide the excellent barrier capabilities. Moreover, it has been confirmed that a similar structure and function can also be obtained when using tungsten.

In addition, a wetting layer such as a titanium layer may be formed after the barrier layer has been formed, but prior to the wafer cooling step described below.

In the present invention, the barrier layer preferably includes at least one compound selected from the group consisting of titanium, cobalt and tungsten and nitrides of these metals. In particular, it is desirable that the barrier layer have a multilayer structure produced by laminating a metal layer formed of titanium, cobalt or tungsten on a layer formed of each nitride of these metals. For instance, when the barrier layer includes a titanium layer and a titanium nitride layer, the contact portion between the impurity diffusion layer of the substrate and the wiring layer has a layer structure substantially including a titanium silicide layer, a crystal layer of titanium nitride and a titanium nitride layer which contains titanium oxide particles in an island-like configuration and has a disordered crystal structure.

Thermal Processing and Wafer Cooling Before Formation of Aluminum Layers

Before the wafer is cooled, further thermal processing (thermal processing C) is performed in the lamp chamber at a base pressure of $1.5 \times 10^{-4}$ Pa or less and a temperature of 150° C. to 250° C. for 30 to 60 seconds, to remove substances such as water that may be adhering to the substrate. After that, but before the aluminum layers are formed, the temperature of the substrate is lowered to 100° C. or lower, preferably to between room temperature and 50° C. This cooling step is important for lowering the substrate temperature that has been increased by the thermal processing C and could be performed by, for example, placing the wafer on a stage that has a water-cooling function and lowering the temperature of the wafer to a predetermined temperature thereby.

This cooling of the wafer ensures that only an extremely small amount of gas escapes from the BPSG layer 30, the barrier layer 33, and all the surfaces of the wafer in the formation step of the first aluminum layer. As a result, the effects of harmful gases adsorbed at the boundary surface between the barrier layer 33 and a first aluminum layer 34 on the coverage and adhesiveness can be prevented.

It is desirable that this cooling step be performed by utilizing the sputtering apparatus for forming aluminum layers which has plural chambers of the same structure. For example, it is desirable that a substrate be placed on a stage of the sputtering apparatus that has a water-cooling function and the temperature of the substrate be lowered to a predetermined temperature. The cooling step will be described in more detail hereinafter.

Figure 2A:
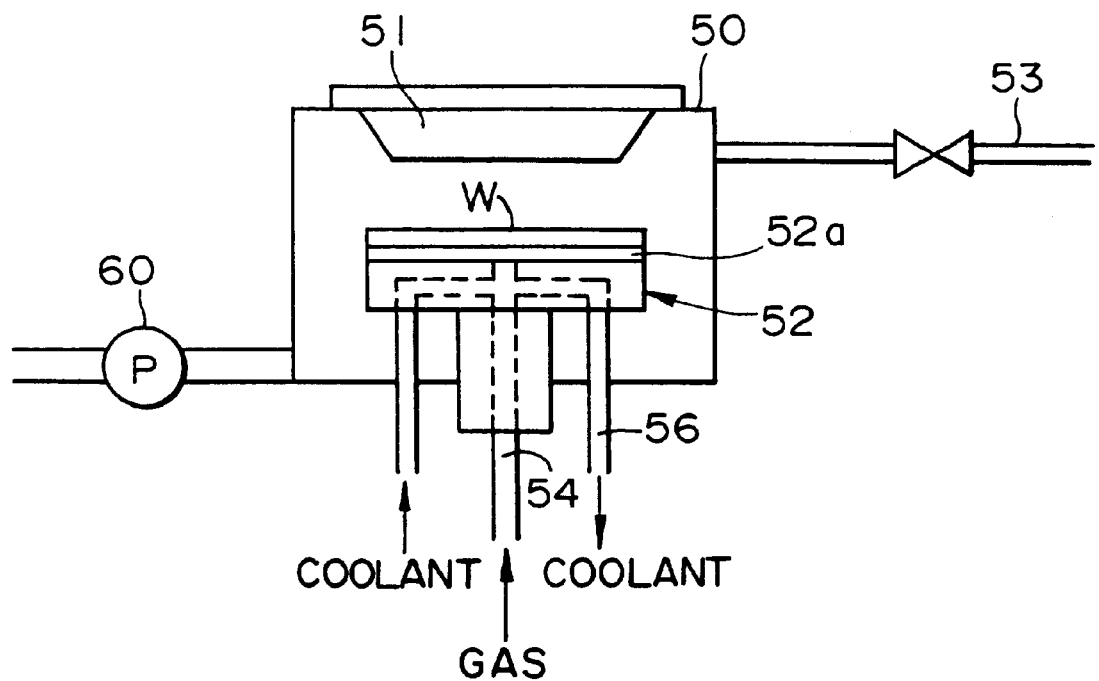
FIG. 2A is a schematic view of an example of a sputtering apparatus used in the embodiment of the present invention.
Figure 2B:
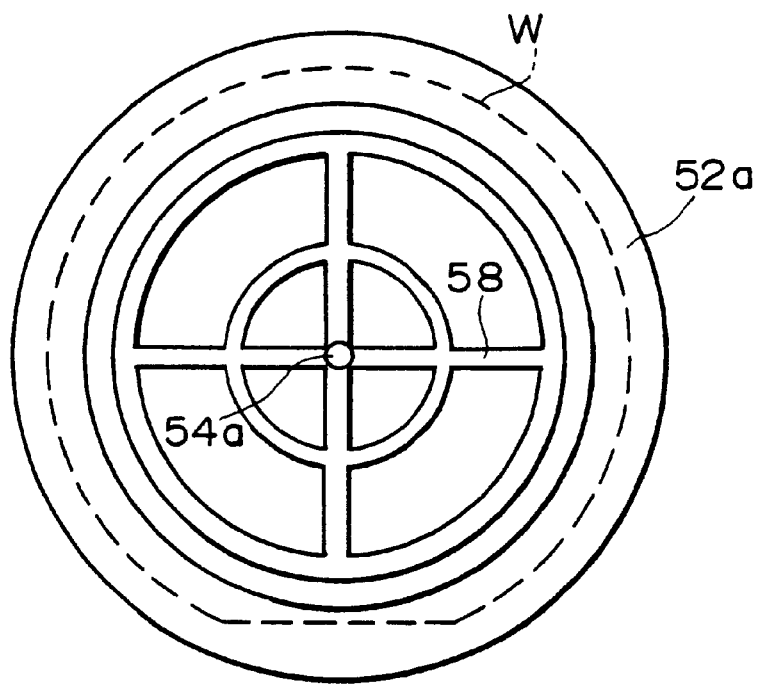
FIG. 2B shows an example of a stage of the sputtering apparatus.

FIG. 2A shows a schematic view of an example of a sputtering apparatus equipped with a stage having a water-cooling function, and FIG. 2B shows a plan view of an example of the stage.

This sputtering apparatus is provided with a plurality of chambers 50 of the same configuration. In the chamber 50, a target 51 which doubles as an electrode and an electrode 52 which doubles as a stage are included, and a substrate (wafer W) to be cooled is placed on the electrode 52. The chamber 50 is equipped with an exhaust system 60 for reducing the pressure inside the chamber and a first gas supply path 53 for supplying a gas to the chamber when aluminum is sputtered. The electrode 52 is provided with a projection-shaped support portion 52a along an outer periphery of the upper surface of the electrode 52, as shown specifically in FIG. 2B, in order to generate a predetermined space between the electrode 52 and wafer W when the wafer W is placed on the electrode 52. Furthermore, a second gas supply path 54 is connected to the electrode 52. A gas as a thermal conduction medium, e.g., argon gas, is supplied from the second gas supply path 54 to a space between the electrode 52 and wafer W. In addition, the electrode 52 doubles as a cooling system for cooling the wafer W. The electrode 52 is adjusted to a constant temperature by circulation of a refrigerant, such as water, supplied from a refrigerant supply path 56. Grooves 58 are formed in a predetermined pattern in the upper surface of the electrode 52, as shown in FIG. 2B, in order to supply a gas equally to the space described above, and a blow-out port 54a of the second gas supply path 54 is provided at a position where the grooves intersect.

The sputtering apparatus described above operates in the following manner to cool the wafer.

The pressure inside of the chamber 50 is reduced to $6 \times 10^{-6}$ Pa or lower by the exhaust system 60, and subsequently the wafer W is placed on the support portion 52a of the electrode 52. The gas as a thermal conduction medium between the electrode 52 and the wafer W is introduced from the second gas supply path 54 to the space between the electrode 52 and the wafer W. The wafer W is cooled while the pressure in the space is kept between 600 and 1000 Pa and the gas leaked out into the chamber is exhausted by the exhaust system 60.

A certain degree of pressure in the space between the electrode 52 and the wafer W is necessary in order to maintain cooling efficiency when the wafer is cooled. That is, it is necessary to improve the thermal conductance between the electrode 52 and the wafer W in order to enhance the cooling efficiency of the wafer W. Also, for this enhancement, it is necessary to increase the pressure of the gas (thermal conduction medium) in the space between the electrode 52 and the wafer W.

It is conceivable as a method for cooling a wafer that the wafer be placed on a stage having a cooling mechanism in a chamber to cool the wafer. According to this cooling step, a gas is not supplied directly into a space between the stage and wafer, but the pressure in the space is caused to be dependent on the pressure in a chamber, so that the pressure inside the chamber must be increased in order to increase the pressure in the space between the stage and wafer. However, if the pressure in the chamber is increased in order to increase the cooling efficiency, there will be a greater number of molecules of gas in the chamber so that the upper surface of the wafer W is likely to be contaminated by the molecules of the gas, resulting in an adverse effect on the reflow of aluminum to cause generation of voids and a high resistance in the wiring. On the contrary, when the pressure in the chamber is decreased in order to prevent the contamination of the wafer, the pressure in the space between the wafer and stage is also lowered. As a result, this causes the thermal conductance between the wafer and stage to drop, resulting in an adverse effect on the cooling efficiency.

According to the cooling step in the present embodiment, the pressure in the space between the electrode 52 and the wafer W is ensured by introducing a gas into the space between the electrode 52 and the rear face of the wafer W, so that the pressure in the space can be controlled independently of that in the chamber. Moreover, by maintaining the pressure of the thermal conduction medium between the wafer and stage at a predetermined value, the pressure in the chamber can be suppressed to between $1 \times 10^{-3}$ and 0.1 Pa independently of the pressure in the space. Therefore, the contamination on the upper surface of the wafer caused by gas molecules can be prevented with certainty. As a result, the improvement of reflowing properties and the low resistance of aluminum can be achieved. Furthermore, the pressure in the space can be set in a range from 600 to 1300 Pa without increasing the pressure in the chamber so that the thermal conductance will be improved, thereby enhancing the cooling efficiency. In this manner, according to the present cooling step, the pressure in the chamber can be lowered while the pressure in the space between the wafer W and electrode 52 is increased, so that good cooling efficiency can be obtained while preventing contamination of the wafer.

Formation of Aluminum Layers

A layer of aluminum comprising 0.1 to 3.0 wt %, preferably 0.3 to 1.0 wt %, of beryllium and 0.2 to 1.0 wt % of copper is first formed at high speed by sputtering to a thickness of 150 to 300 nm at not more than 200° C., more preferably 30° C. to 100° C., to form the first aluminum layer 34. The wafer is then heated within the same chamber to raise the temperature thereof to between 350° C. and 460° C., and a layer of aluminum containing beryllium and copper is similarly formed at low speed by sputtering to a thickness of between 300 and 600 nm, to form a second aluminum layer 35. In this case, the "high speed" used during the formation of the aluminum layers depends on the formation conditions or design details of the device being fabricated and thus cannot be specified unconditionally. However, as a rule this means a sputtering speed of at least 10 nm/s, and "low speed" means a sputtering speed of 3 nm/s or less.

The aluminum layer may contain, as required, magnesium, titanium, silicon or the like as well as the aforementioned beryllium and copper.

The sputtering of aluminum is performed in the sputtering apparatus, shown in FIGS. 2A and 2B, used when the wafer is cooled, as previously described. In this manner, by performing the cooling step and aluminum forming step in the same apparatus in which a reduced pressure is maintained, the step for transferring and installing wafers will be eliminated, resulting in the facilitation of the steps and prevention of contamination of wafers.

Here, in the sputtering apparatus shown in FIGS. 2A and 2B, argon gas is supplied both from the first gas supply path 53 and second gas supply path 54. The temperature at which aluminum layers are formed refers to the temperature of the wafer W (substrate temperature) controlled by the gas supplied from the second gas supply path 54.

Figure 3:
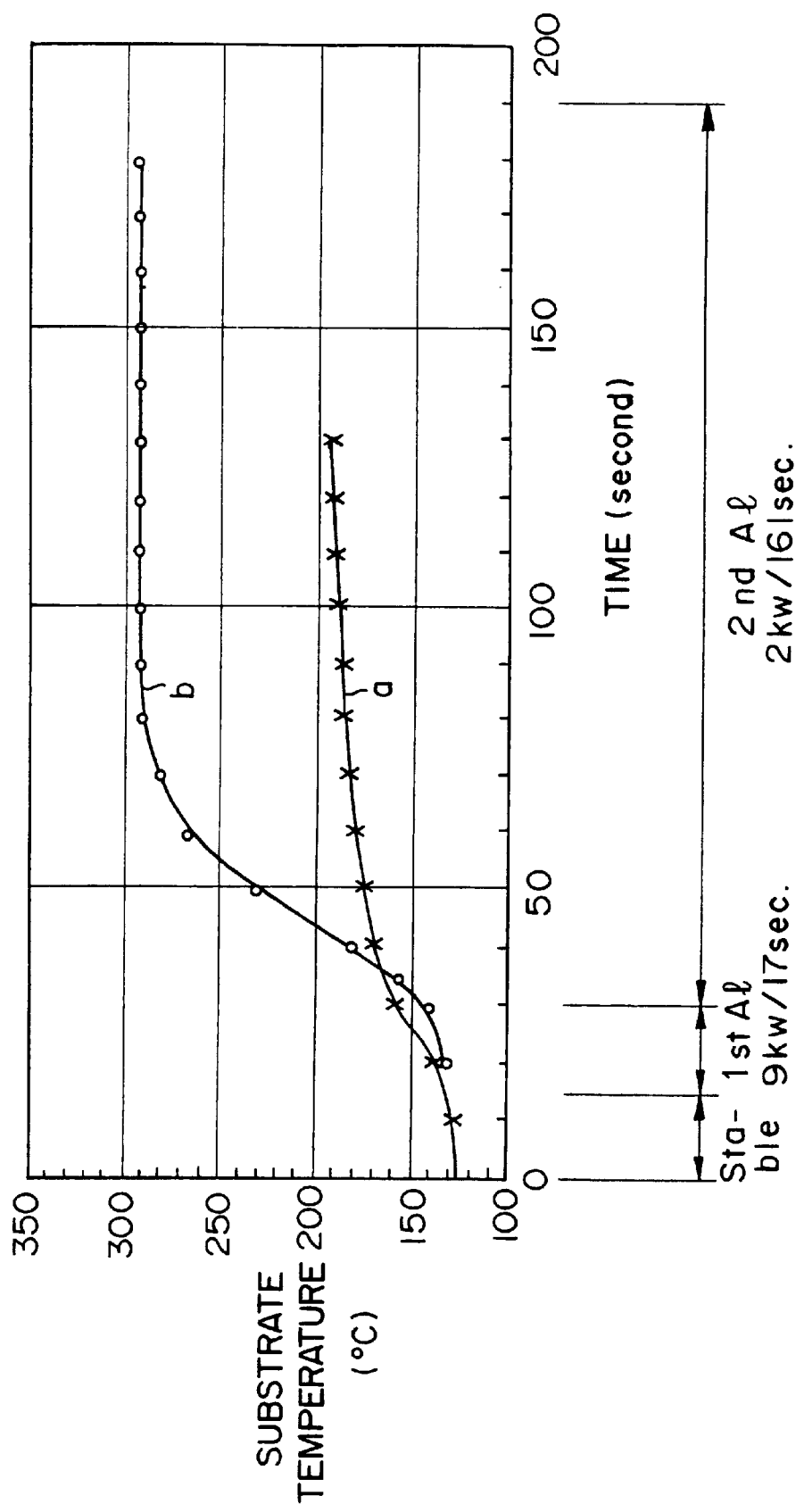
FIG. 3 is a graph of the relationship between time and substrate temperature, when the substrate temperature is controlled by the sputtering apparatus shown in FIGS. 2A and 2B.

An example of the substrate temperature controlled by using this sputtering apparatus is shown in FIG. 3. In this graph, elapsed time is plotted along the horizontal axis and substrate (wafer) temperature along the vertical axis. In FIG. 3, "a" denotes the changes in substrate temperature when the temperature of the stage 52 of the sputtering apparatus is set at 350 ° C., and "b" denotes the changes in substrate temperature when the temperature of the stage 52 is increased by supplying argon gas through the second gas supply path 54 into the chamber.

The substrate temperature could be controlled as described below, by way of example. First of all, the temperature of the stage 52 is previously set to the temperature for forming the second aluminum layer (350° C. to 500° C.). During the formation of the first aluminum layer, there is no supply of gas from the second gas supply path 54, so the substrate is heated by the stage 52 and thus the temperature rises gradually as shown by "a" in FIG. 3. During the formation of the second aluminum layer, the temperature of the substrate is controlled by the supply of heated gas through the second gas supply path 54 so that it rises rapidly and is held constant at a predetermined value, as shown by "b" in FIG. 3.

In the example shown in FIG. 3, the first aluminum layer 34 is formed while the stage temperature is set at 350° C. and the substrate temperature is set at between 125° C. and 150° C., and the second aluminum layer 35 is formed immediately afterwards.

Control over both the formation speed and substrate temperature during the formation of the aluminum layers is important as well as control over the power applied to the sputtering apparatus. In other words, relating to the formation speed, it is important that the power does not fall to zero while switching from high power to low power while the first aluminum layer 34 is formed at high power and the second aluminum layer 35 is formed at low power. If the power falls to zero, an oxide layer will be formed on the surface of the first aluminum layer under the reduced pressure, causing the wettability of the second aluminum layer to deteriorate with respect to the first aluminum layer and worsening the adhesiveness therebetween. In other words, applying the power constantly ensures that active aluminum is supplied continuously to the surfaces of the aluminum layers during the formation, making it possible to suppress the formation of oxide layers. Note that the magnitude of the power depends on factors such as the sputtering apparatus and formation conditions, and thus cannot be specified unconditionally, but it is preferable to have a high power level of 5 kW to 10 kW and a low power level of 300 W to 1 kW under the temperature conditions shown in FIG. 3 by way of example.

The temperature and power can be controlled strictly by forming the first aluminum layer 34 and the second aluminum layer 35 consecutively within the same chamber in this manner, making it possible to form the aluminum layers efficiently at a lower temperature and more stably than in the conventional art.

In order to form successive layers with good step coverage, and also to suppress the escape of gasifiable components from the barrier layer 33 and the BPSG layer 30 that form the interlayer dielectric underneath this aluminum layer 34, it is preferable to select an optimum range for the thickness of the first aluminum layer 34, for example, of 200 to 400 nm. For the second aluminum layer 35, the thickness is determined by factors such as the size and aspect ratio of the through-hole, so a thickness of 300 to 1000 nm is necessary for filling a hole having a diameter of 0.5 μm or less with an aspect ratio of 3, for example.

After the first aluminum layer 34 and the second aluminum layer 35 are formed, thermal processing is performed at 200 to 500° C. By this thermal processing, a beryllium alloy (for example, a beryllium/copper alloy or an aluminum/beryllium/copper alloy) precipitates at the grain boundary of aluminum to thereby restrain the migration of an aluminum atom. Beryllium itself as a solid solution can improve the strength of an aluminum alloy with the effect of restraining the migration of an aluminum atom. These effects improve the resistance to electro-migration in the metal wiring layer.

Formation of Antireflection Layer

An antireflection layer 36 having a thickness of 30 to 80 nm is then formed by the deposition of titanium nitride by sputtering in a separate sputtering chamber. The stack consisting of the barrier layer 33, the first aluminum layer 34, the second aluminum layer 35, and the antireflection layer 36 is then selectively etched by an anisotropic dry etcher using mainly gases of $Cl_2$ and $BCl_3$, to pattern a metal wiring layer 40 therefrom.

It has been confirmed that aluminum can be embedded within a through-hole having a diameter of 0.2 to 0.8 μm and with an aspect ratio of 0.5 to 3 in the thus-formed metal wiring layer 40, with good step coverage without creating any voids.

EXPERIMENTAL EXAMPLE (1) Electro-migration Resistance of a Metal Wiring Layer

The ratio (wt %) of beryllium to copper which were added to an aluminum alloy was altered to measure the defect ratio in an electro-migration test. The results are shown in FIG. 8. In FIG. 8, the stress time, namely the time during which current flows, is plotted along the horizontal axis, and the defect ratio is plotted along the vertical axis. Also, "a", "b", "c" and "d" in FIG. 8 show the results when the following metals were added to aluminum respectively.

"a": copper (0.5 wt %)
"b": copper (0.5 wt %), beryllium (0.1 wt %)
"c": copper (0.5 wt %), beryllium (0.3 wt %)
"d": copper (0.1 wt %), beryllium (0.3 wt %)

It is confirmed from FIG. 8 that, compared with the case of adding only copper to aluminum, a further addition of beryllium to aluminum containing copper reduces the defect ratio. It is also seen from the data shown by the symbols a and b in the graph that the defect ratio decreases as the amount of beryllium increases. As stated above, it is clear that an addition of beryllium to the aluminum alloy improves the electro-migration resistance.

(2) Structure of Barrier Layer and Barrier Properties (a) Analysis of Layer Structure using Transmission Electron Microscope (TEM)

Figure 6:
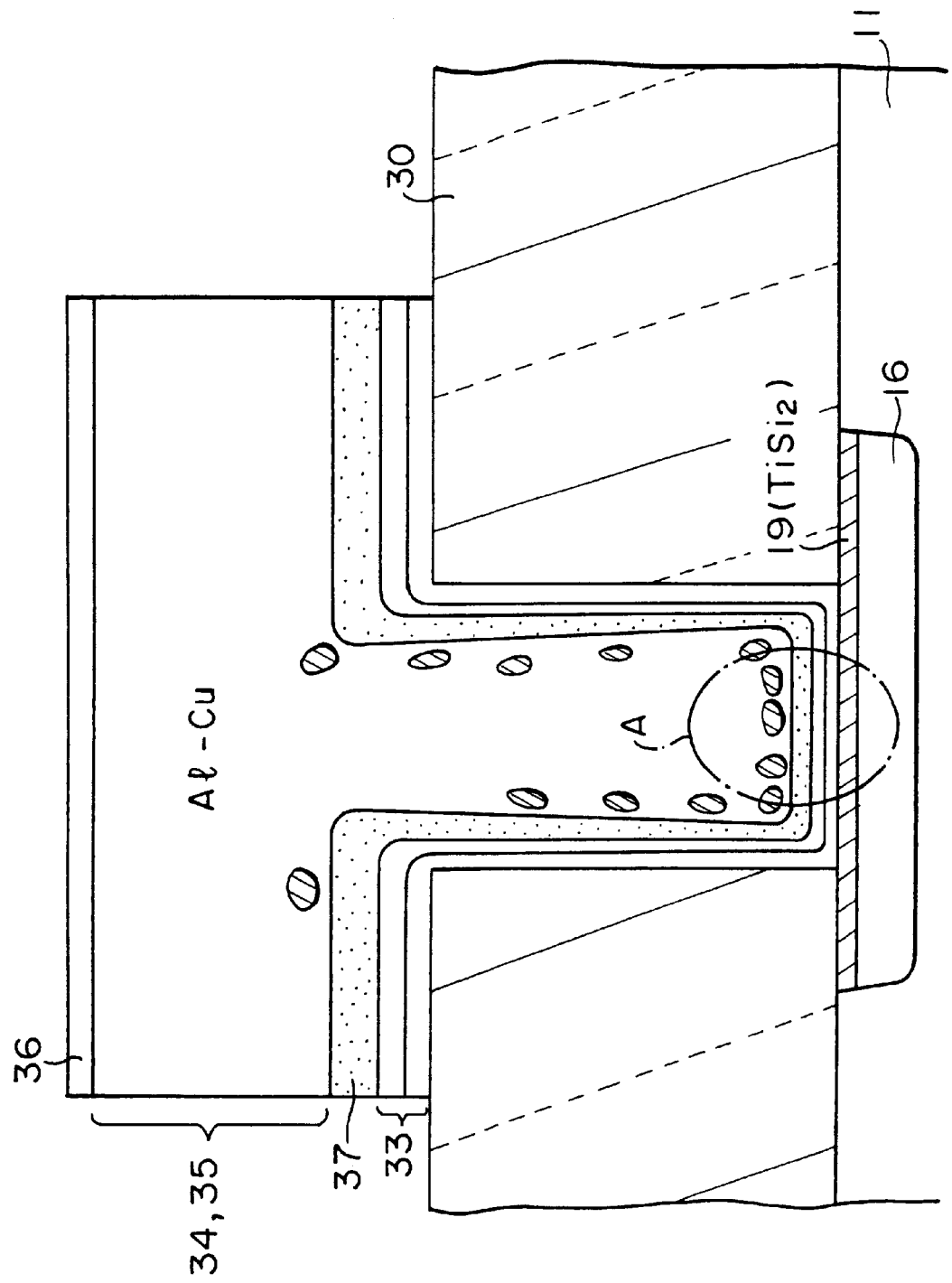
FIG. 6 is a schematic view showing a cross-sectional structure of a contact portion in the semiconductor device in accordance with the present invention.
Figure 7:
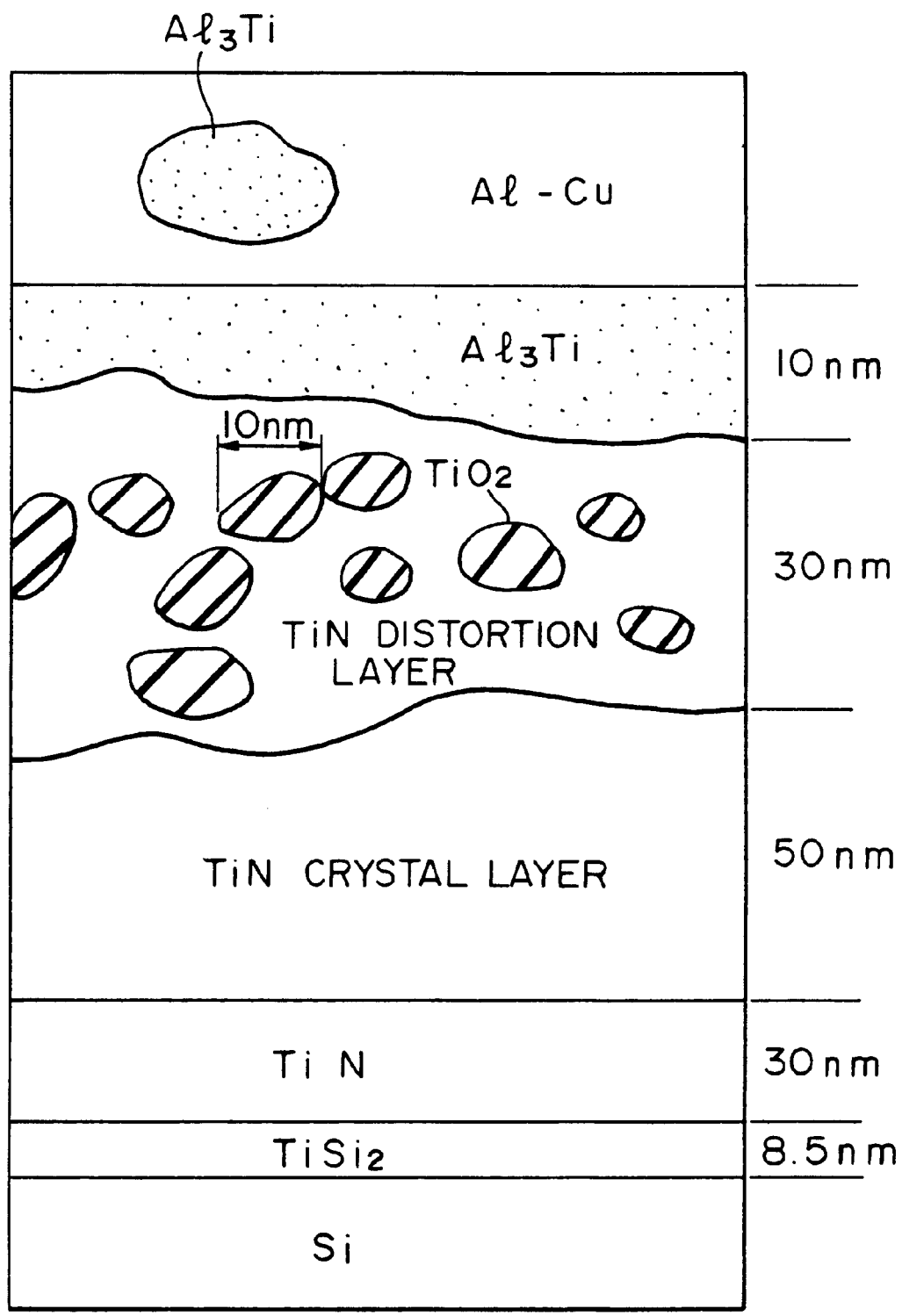
FIG. 7 is a diagram made on the basis of a micrograph of a transmission electron microscope for a cross section of the semiconductor device in accordance with the present invention.

A semiconductor device was formed as a sample with a structure shown in FIG. 1 using the method described above, and an electron micrograph of a cross section of a region including a contact portion was taken. The cross-sectional structure on the basis of the electron micrograph is schematically shown in FIG. 7. The cross-sectional structure of this contact portion is shown in FIG. 6 schematically. FIG. 7 shows the structure of a portion denoted by a symbol "A" in FIG. 6. The sample used in this experiment was formed in the manner described below.

First, as shown in FIG. 6, after the interlayer dielectric 30 was formed on the silicon substrate 11 on which an electronic element had been formed, a through-hole having a diameter of 0.3 μm was formed. Subsequently, titanium and titanium nitride layers were deposited by sputtering. Then, the wafer was exposed to oxygen plasma, and annealed in a nitrogen atmosphere at a temperature of 600° C. to form the barrier layer 33. Then, a titanium layer was formed by collimate sputtering as a wetting layer 37. The first aluminum layer 34 including beryllium and copper was then formed, followed by the second aluminum layer 35 including beryllium and copper. The antireflection layer 36 comprising a titanium nitride layer was then formed by sputtering.

As shown in FIG. 7, the composition and thickness of each layer of the contact portion obtained on the basis of the micrograph from the transmission electron microscope are shown as follows.

| | |
|---|---|
| Silicon substrate (Si) | |
| Titanium silicide layer (TiSi₂) | 8.5 nm |
| Titanium nitride layer (Ti₂N; A titanium-rich layer produced by the reaction of titanium in the titanium layer and nitrogen in the titanium nitride layer) | 30 nm |
| Titanium nitride crystal layer (TiN) | Abt. 50 nm |
| Titanium nitride distortion layer (A layer in which crystal particles of TiO₂ are dispersed in a TiN layer) | Abt. 30 nm |
| Aluminum-titanium layer (Al₃Ti) | Abt. 10 nm |
| Aluminum-copper layer (Al—Cu) | |

From FIG. 7, it will be noted that crystals of titanium oxide are distributed in particulate condition in a layer with a thickness of approximately 30 nm over the titanium nitride (TiN) layer forming the barrier layers 33. The titanium oxide crystals had an average particle diameter of approximately 10 nm. As the crystal particles of titanium oxide are distributed in an island-like configuration, a crystal lattice in the titanium nitride layer is distorted. This is referred to as a titanium nitride distortion layer. This titanium nitride distortion layer and the particles of titanium oxide restrain the diffusion of aluminum, thereby significantly improving the barrier properties. The material of the particles dispersed in the titanium nitride layer was determined by performing a Fourier transform for an image obtained from the transmission electron microscope and by observing the lattice image.

Further, titanium included in the wetting layer becomes an alloy of an Al₃Ti system by reacting with aluminum, and the aluminum (Al—Cu) layer is formed on this wetting layer. The barrier layer does not react with the alloy of Al₃Ti system and is provided with stable and excellent barrier properties and conductivity.

(b) Barrier Properties

Leak properties were examined for the sample according to the present invention and a comparison sample that is similar to the sample of the present invention except that it includes no titanium oxide crystals in the barrier layer, by using a transmission electron microscope and by subjecting the samples to thermal processing. The leak property, in terms of the annealing conditions when a leakage current was generated at the contact portion, was determined for the samples annealed under various conditions.

As a result, the sample of the present invention exhibited no leakage current and spike phenomenon in which aluminum invades into the silicon substrate through the barrier layer, even after the sample was subjected to annealing for 10 hours at a temperature of 550° C. On the contrary, the comparison sample was confirmed to have a leakage current on annealing for two hours at a temperature of 450° C.

From the fact described above, it was confirmed that the sample according to the present invention had barrier properties superior to the comparison sample.

(3) Studies on the Influences of Degassing Step

Figure 4:
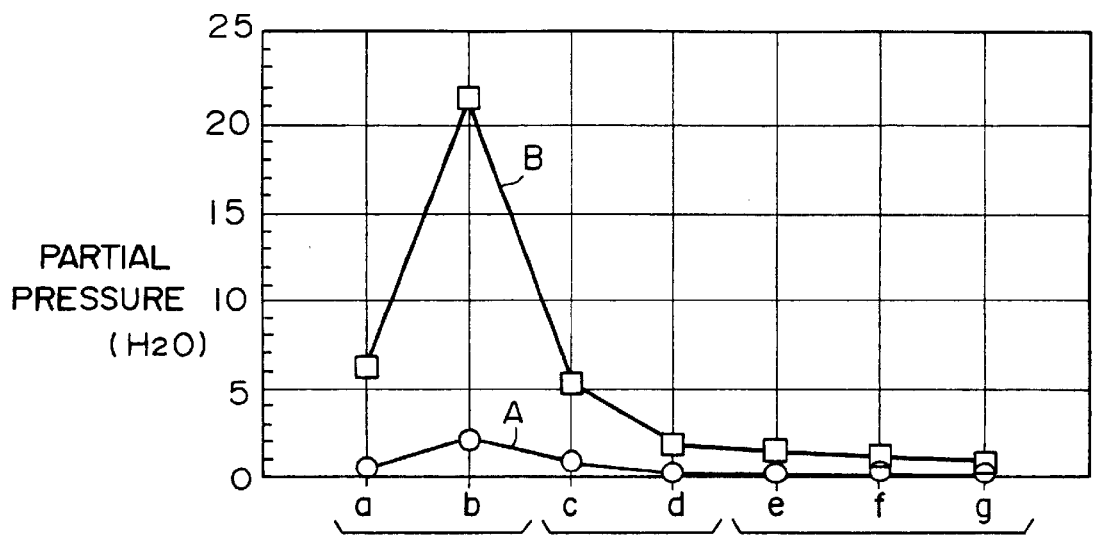
FIG. 4 shows the relationship between the process timing and partial pressure of a residual gas (water) in a chamber in the method of fabricating a semiconductor device in accordance with the present invention.
Figure 5:
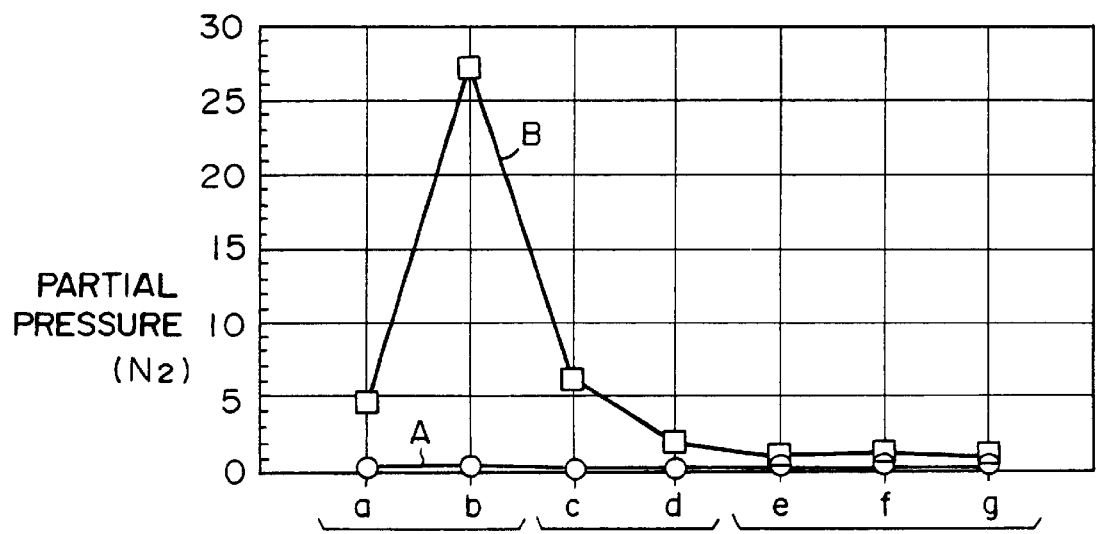
FIG. 5 shows the relationship between the process timing and partial pressure of a residual gas (nitrogen) in a chamber in the method of fabricating a semiconductor device in accordance with the present invention.

FIG. 4 and FIG. 5 show experimental results for inspecting the influence of degassing step on the amount of gas (partial pressure) discharged from the wafer.

In FIGS. 4 and 5, the horizontal axis shows the timing of processing from the thermal processing (thermal processing C) performed before the aluminum layer is formed through formation of the second aluminum layer 35, and the vertical axis shows the partial pressure of the residual gas in the chamber. In FIGS. 4 and 5, the line denoted by "A" shows a change in the case where the wafer is subjected to the degassing step after the interlayer dielectric is formed, and the line indicated by "B" shows a change in the case where the wafer is not subjected to the degassing step after the interlayer dielectric is formed. In this experimental example, the degassing step was performed at an air pressure of 0.1 to 1 Pa and a temperature of 460° C. for 120 seconds.

In each Figure, "a" and "b" of the horizontal axis denote the timing in the thermal processing C (in a first chamber) performed before the formation of the aluminum layer, "a" indicates the timing immediately after the wafer is inserted into the first chamber and "b" indicates the timing when the wafer is heated for 60 seconds at a temperature of 250° C. by a lamp. The air pressure in the first chamber is set at 1×10⁻⁴ Pa or less.

In each Figure, "c" and "d" show the timing in the cooling step (in a second chamber) of the wafer, "c" designates the timing immediately after the wafer is inserted into the second chamber and "d" designates the timing when the wafer is cooled to a temperature of 20° C. The air pressure in the second chamber is set at 3×10⁻¹ Pa. When the partial pressure was measured, the air pressure in the chamber was reduced to 3×10⁻⁶ Pa.

Further, "e", "f", and "g" show the timing in the aluminum layer forming step (in a third chamber). Specifically, "e" designates the timing immediately after the wafer is inserted into the third chamber, "f" designates the timing immediately after the first aluminum layer is formed, and "g" designates the timing immediately after the second aluminum layer is formed. The air pressure in the third chamber is set at 3×10² Pa. When the partial pressure was measured, the air pressure in the chamber was reduced to 3×10⁻⁶ Pa.

From FIGS. 4 and 5, it was confirmed that very little water and nitrogen were generated in the thermal processing and aluminum layer forming steps by performing the degassing step after the interlayer dielectric was formed but before the barrier layer was formed. On the contrary, it will be noted that when the degassing step is not performed, a large amount of water and nitrogen are discharged in the subsequent thermal processing step, in particular, in the thermal processing C designated by "b".

The reason that the first and second aluminum layers 34 and 35 are embedded in the through-hole in an excellent manner according to the present embodiment as described above is believed to be as follows.

(a) By adding at least beryllium in the aluminum alloy, beryllium occludes oxygen in aluminum to improve the fluidity of aluminum. As a consequence, the aluminum alloy can be well-embedded in the through-hole. The improvement in the fluidity of aluminum can also reduce the temperature in the sputtering and the occurrence of whiskers of aluminum can be limited.

(b) By the degassing step, water, hydrogen, oxygen, or nitrogen included in the interlayer dielectric, particularly, in the BPSG layer and silicon oxide layer obtained by the reaction of a silicon compound and hydrogen peroxide is gasified and discharged sufficiently. This makes it possible to prevent generation of a gas from the interlayer dielectric and barrier layer 33 in the subsequent steps of forming the first aluminum layer 34 and the second aluminum layer 35, enabling increased adhesion of the barrier layer 33 and first aluminum layer 34, as well as the layer formation with good step coverage.

(c) In the formation of the first aluminum layer 34, the substrate temperature is set at a relatively low temperature of 200° C. or lower to prevent water or nitrogen included in the interlayer dielectric and barrier layer 33 from being discharged. By performing this operation in addition to the degassing step, the adhesion of the first aluminum layer 34 can further be improved.

(d) Furthermore, because the first aluminum layer 34 itself restrains the generation of a gas from the lower layer when the substrate temperature is increased, the next second aluminum layer 35 can be formed at a relatively high temperature. This ensures that the second aluminum layer will flow and diffuse more advantageously.

As described above, according to the method of the present invention which uses an aluminum alloy containing at least beryllium, preferably comprises at least the degassing step and cooling step prior to sputtering of an aluminum layer, and forms the aluminum layer continuously in the same chamber, a through-hole having a diameter of approximately 0.2 μm can be filled with only aluminum or an aluminum alloy, resulting in an improvement in the product reliability and yield. The reliability of the device according to the present invention has also been confirmed in terms of migration or the like, with no segregation of copper or the like from the aluminum layer of the contact portion, nor abnormal growth of crystal particles.

Furthermore, the barrier layer in the semiconductor device of the present invention preferably contains metal oxide scattered in an island-like configuration, so that the semiconductor device has superior barrier properties while securing the conductivity in the barrier layer.

Although the present embodiment has been described for the semiconductor device including an N channel MOS element, the present invention can also be applied to a semiconductor device including a P channel or CMOS type element. In the foregoing embodiment, though the metal wiring layer for the first layer is described, the present invention can also be applied to metal wiring layers for the second and upper layers.

The through-hole of the present invention is not limited to those formed by anisotropic dry etching, but includes those having an appropriate taper end, which are formed by a combination of an isotropic wet etching and anisotropic dry etching. For instance, when a through-hole of this type is used and the through-hole has a diameter of 0.5–0.8 μm with respect to the lower portion formed by an anisotropic dry etching with an aspect ratio of 0.5–3, the second aluminum layer film can be formed at 300 to 350° C. Hence a sputter which is usual but not specific in terms of temperature can be used showing that this through-hole is useful in practical applications.

What is claimed is:

1. A semiconductor device, comprising:
    a semiconductor substrate including an electronic element,
    at least one metal wiring layer,
    at least one interlayer dielectric having a through-hole therein, and
    a barrier layer formed at least on a surface of the interlayer dielectric and on a surface of the through-hole formed in the interlayer dielectric, wherein
    the barrier layer includes a crystal layer and a distortion layer, the distortion layer including an oxide of a metal that is distributed in the barrier layer in an island-like configuration, and
    the metal wiring layer contains aluminum as a major component and 0.1 wt % to 3 wt % beryllium.

2. The semiconductor device as defined in claim 1, wherein the proportion of beryllium is in a range between 0.3 wt % and 1 wt %.

3. The semiconductor device as defined in claim 1, wherein the metal wiring layer further contains at least one of magnesium and titanium in a proportion of 0.1 wt % to 3 wt %.

4. The semiconductor device as defined in claim 1, wherein a gasifiable component is excluded from the interlayer dielectric by thermal processing.

5. The semiconductor device as defined in claim 1, wherein the crystal layer and the distortion layer consist of titanium nitride.

6. A method of fabricating a semiconductor device comprising a semiconductor substrate including an electronic element, at least one metal wiring layer, at least one interlayer dielectric having a through-hole therein, and a barrier layer formed at least on a surface of the interlayer dielectric and on a surface of the through-hole formed in the interlayer dielectric, the method comprising the steps of:
    forming the barrier layer including a crystal layer and a distortion layer, the distortion layer including an oxide of a metal that is distributed in the barrier layer in an island-like configuration, and
    forming the metal wiring layer by depositing a metal layer that contains aluminum as a major component and 0.1 wt % to 3 wt % beryllium on the surface of the interlayer dielectric and in the through-hole formed in the interlayer dielectric.

7. The semiconductor device as defined in claim 6, wherein the beryllium alloy is a beryllium/copper alloy.

8. The semiconductor device as defined in claim 6, wherein the beryllium alloy is an aluminum/beryllium/copper alloy.

9. The semiconductor device as defined in claim 6, wherein the metal wiring layer contains least one of magnesium and titanium in a proportion of 0.1 wt % to 3 wt %.

10. The semiconductor device as defined in claim 6, wherein the metal wiring layer has an improved electromigration resistance.

11. The method of fabricating a semiconductor device as defined in claim 6, wherein the crystal layer and the distortion layer consist of titanium nitride.

12. The method of fabricating a semiconductor device as defined in claim 6, further comprising the step of forming the through-hole in the interlayer dielectric.

13. The method of fabricating a semiconductor device as defined in claim 12, wherein the proportion of beryllium is in a range between 0.3 wt % and 1 wt %.

14. The method of fabricating a semiconductor device as defined in claim 12, wherein the metal wiring layer contains at least one of magnesium and titanium in a proportion of 0.1 wt % to 3 wt %.

15. The method of fabricating a semiconductor device as defined in claim 12, wherein the metal wiring layer is formed by sputtering a target material containing aluminum as a major component and 0.1 wt % to 3 wt % beryllium at a temperature of 500° C. or less.

16. The method of fabricating a semiconductor device as defined in claim 12, wherein the metal wiring layer is formed by:
    a step of forming a first aluminum layer comprising an alloy containing aluminum as a major component at a temperature of 200° C. or less; and
    a step of forming a second aluminum layer comprising an alloy containing aluminum as a major component at a temperature of 300° C. to 500° C. on the first aluminum layer.

17. The method of fabricating a semiconductor device as defined in claim 16, wherein the first aluminum layer and the second aluminum layer are continuously formed in the same chamber.

18. The method of fabricating a semiconductor device as defined in claim 16, further comprising a step of cooling the temperature of the semiconductor substrate to 100° C. or less prior to the formation of the first aluminum layer.

19. The method of fabricating a semiconductor device as defined in claim 12, wherein forming the metal wiring layer is followed by a thermal processing performed at a temperature of 200° C. to 500° C.

20. The method of fabricating a semiconductor device as defined in claim 12, further comprising a degassing step of eliminating a gasifiable component contained in the interlayer dielectric by a thermal processing performed at a substrate temperature of 300° C. to 550° C. under a reduced pressure, after forming the through-hole.

21. The method of fabricating a semiconductor device as defined in in claim 12, further comprising a step of forming the barrier layer at least on the surface of the interlayer dielectric on the semiconductor substrate and on the surface of the through-hole formed in the interlayer dielectric, wherein the barrier layer is formed by introducing oxygen into a layer which will become the barrier layer to distribute an oxide of a metal that is included in the barrier layer in an island-like configuration.

22. The method of fabricating a semiconductor device as defined in claim 21, wherein the barrier layer is formed by depositing a layer that will become the barrier layer and by exposing the layer to oxygen plasma under a reduced pressure, followed by a thermal processing so that an oxide of a metal that is included in the barrier layer is distributed in an island-like configuration.

23. The method of fabricating a semiconductor device as defined in claim 21, wherein the barrier layer is formed by depositing a layer that will become the barrier layer and by thermally processing the layer in an oxygen atmosphere so that an oxide of a metal that is included in the barrier layer is distributed in an island-like configuration.

24. A semiconductor device comprising a semiconductor substrate including an electronic element, at least one metal wiring layer, at least one interlayer dielectric, wherein the metal wiring layer contains aluminum as a major component and 0.1 wt % to 3 wt % of beryllium, and a barrier layer formed at least on a surface of the at least one interlayer dielectric, the barrier layer including a crystal layer and a distortion layer, the distortion layer including an oxide of a metal that is distributed in the barrier layer in an island-like configuration; and wherein a beryllium alloy precipitates at the grain boundary of the aluminum.

25. A semiconductor device, comprising:

a semiconductor substrate including an electronic element, at least one metal wiring layer, at least one interlayer dielectric having a through-hole therein, and a barrier layer formed at least on a surface of the interlayer dielectric and on a surface of the through-hole formed in the interlayer dielectric, wherein the barrier layer includes a crystal layer and a distortion layer, the distortion layer including an oxide of a metal that is distributed in the barrier layer in an island like configuration.

* * * * *